United States Patent
Coley et al.

(10) Patent No.: US 7,262,663 B2
(45) Date of Patent: Aug. 28, 2007

(54) ULTRA HIGH LINEARITY AMPLIFIER

(75) Inventors: William H. Coley, Longmont, CO (US); Stephen B. Venzke, Loveland, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 97 days.

(21) Appl. No.: 11/259,507

(22) Filed: Oct. 26, 2005

(65) Prior Publication Data

US 2007/0090878 A1    Apr. 26, 2007

(51) Int. Cl.
*H03F 3/45* (2006.01)
(52) U.S. Cl. .................... 330/259; 330/297
(58) Field of Classification Search ............ 330/9, 330/127, 259, 260, 290, 297
See application file for complete search history.

(56) References Cited

U.S. PATENT DOCUMENTS 4,479,093 A * 10/1984 Mattisson ............ 330/258
5,424,683 A * 6/1995 Takahashi ............ 330/259
6,040,741 A * 3/2000 Van der Pol ............ 330/297

* cited by examiner

*Primary Examiner*—Khanh Van Nguyen

(57) ABSTRACT

The output of a commercially available integrated high gain differential amplifier that already has reasonable linearity is connected back to the (−) input to obtain the well known circuit configuration for a non-inverting amplifier, whose gain may be unity or greater, and whose linearity in response to the (+) input is to be improved. We operate the part with power supplies that are dynamically varied to always be the amplifier input+N volts and that input−N volts. This allows the part to remain a low voltage swing part (±N volts) even though the actual output might swing several times that ±N volts. It improves linearity because the part is almost always operating at nearly 'the same operating point' relative to the perceived power supplies. The dynamically tracking power supplies maybe obtained from plus and minus higher voltage work supplies and the use of symmetrical current mirrors to produce matched ±N volt offsets that are referenced to the input of the amplifier.

14 Claims, 3 Drawing Sheets

ULTRA HIGH LINEARITY AMPLIFIER

BACKGROUND OF THE INVENTION

There are many electronic applications for a unity gain amplifier, which manner of electronic circuit is also often referred to as a unity gain buffer, as well as for amplifiers that have a gain greater than unity. One application that places relatively high demands for good performance upon such an amplifier or buffer is at the 'front end' of a laboratory quality high accuracy DC DVM (Digital Volt Meter). Nowadays, high accuracy usually means seven to nine digits of resolution, with perhaps just a few counts of error in the least significant digit. Most DC DVMs also measure AC with reduced accuracy for pure sinusoids having frequencies up to about one to, in some cases, as high as ten megahertz. The 'front end' of a DVM is a location therein after any input attenuation, but before the actual measurement mechanism.

It is immediately clear that any unity gain buffer in such a location does indeed have stringent performance requirements, since it generally is not possible to subsequently distinguish between what the input to be measured actually is and an error introduced by the buffer. Whether the gain is EXACTLY unity is probably not the real issue—calibration can be expected to take care of any uniform gain error. Instead, there are other issues, such as stability and ageing. Does it maintain whatever gain it has over time and with variations in temperature, etc? Assuming those concerns can be adequately addressed, another important issue is linearity. That is, does the gain remain the same for inputs of various amplitudes?

One of the mechanisms that, regardless of their gain, some amplifiers exhibit that causes such behavior is a change in output voltage as input voltages that actually are equal vary over their allowed range. This phenomenon has a name: Common Mode Rejection, or CMR. It is commonly expressed as a ratio, and a value in the range of 80-120 dB is common. The internal causes within the amplifier that limit its CMR can also operate to make it to appear that the gain of the amplifier is not constant over different levels of input. (CMR can be modeled as an input that affects the output, and an incorrect output will appear to be of the wrong gain.) Gain that is not constant when it should be is an issue of non-linearity.

This lack of linearity can be a serious problem, as the input buffer to an eight digit DVM probably needs to faithfully reproduce inputs over at least the range of ±10 VDC, and preferably ±12 VDC. Good stability is wasted if the circuit cannot operate with sufficient linearity to avoid the introduction of error ahead of the actual measurement circuitry, and a suspected or known lack of linearity is very difficult to correct once it is on the loose! The preferred choice is to not introduce any non-linearity in the first place. One the other hand, as purveyors of fine quality electronic test equipment that must compete in the marketplace, we also experience the urge to control the manufacturing cost of our products, among which are laboratory grade high accuracy DVMs. It seems that we need a low cost high linearity fairly wide range unity gain amplifier, with a decided emphasis on high linearity. To be specific, we'd like a unity gain buffer having a CMR of 140 dB, or more, or at least 15 ppb (parts per billion, with a 'b'!) linearity over ±12 VDC for the lowest possible cost, and that will also work respectably up to, for one particular case of interest, 150 kilohertz for AC measurements. We can also readily appreciate that there are comparable situations in other applications where the amplifier is expected to have a gain greater than unity. What to do?

SUMMARY OF THE INVENTION

An attractive place to begin is with a commercially available packaged IC part whose circuit configuration is that of a high gain differential amplifier that already has reasonable linearity, and that otherwise meets familiar requirements. By connecting the output back to the (−) input we obtain with the well known circuit configuration a unity gain amplifier, and whose linearity we intend to improve. One requirement that we can relax, for reasons that will shortly become clear, is the rated amount of output signal swing and the related size of the voltages for the associated plus and minus power supplies (p/s) needed by the part to achieve a large output swing. As an example, we might select a lower cost part with five volt peak-to-peak output swing (and ±3V p/s) with otherwise attractive specifications, as opposed to a more expensive part with a twenty-five or thirty volt swing (with ±18V p/s) that we would ordinarily expect to use (and pay extra for) in order to provide at least a ±12V output swing. (That's right, we DO intend to get a twenty-four volt swing out of a five volt part, and drastically improve its linearity in the process . . . .)

To be sure, we can't modify the part. Its internal workings are beneath an hermetic seal, and would not in any case would not be susceptible of having their cast-in-silicon arrangement changed. We neither need nor want to modify the part itself. What we do instead is operate it in a surrounding environment that 'already contains the output' and that fools the part into thinking that it is getting an error signal that allows it to correct any observable non-linearity in that output. To do this we operate the (five volt) part with tracking power supplies that are dynamically varied to always be a replica of the input plus three volts and the replica minus three volts (where the value of three volts is, of course, related to the five volt part—a different part might use a different power supply offset voltage). This allows the part to remain a low voltage part that experiences only its customary power supply values and is never required to produce a larger (or even a modest) output swing. It also improves linearity because as far as the part is concerned, it is almost always operating under the same conditions (at nearly 'the same operating point' relative to the perceived power supplies). That is, the desired output (which may be equal to the input for unity gain, or some gain times the input otherwise) is 'encoded,' as it were, as the midpoint between the two tracking power supplies. As a consequence, the interior difference forming mechanisms and the source-sink/push-pull output mechanism within the part are almost always 'idling in the middle' as opposed to working significantly to get their outputs to 'move.' We might say that this minimizes the opportunity for the part's inherent non-linearity to manifest itself. A further improvement in linearity results because now the feedback loop is free to devote the entire gain resource of the amplifier to null out any detected difference between the applied input and the already fairly linear output (any remaining attempted inherent non-linearity becomes food for feedback). The feedback is also more than enough to take care of any mischief caused by slight errors in the tracking power supplies, so that they are not required to behave in a precise manner, except that we must ensure that they have bandwidth and a slewing rate sufficient to keep up with the amplifier's output. The result is unmatched linearity that cannot be obtained by operating the part in the conventional manner.

The dynamically tracking power supplies may be obtained from plus and minus high voltage (±18V) work supplies that use symmetrical current mirrors to produce matched ±3V offsets that are referenced to the output of the unity gain amplifier. This is appropriate for this example of unity gain, since in that case the output equals the input. Either a filter or an auxiliary buffer amplifier may be used to decouple the input to the tracking power supplies from the output of the unity gain amplifier that might otherwise sustain oscillations involving coupling realized through power supply variation. The villain here would be either imperfect common mode rejection by the amplifier for its power supplies, or, failure of the tracking for the power supplies to be exactly symmetrical.

Relatively simple modifications can be incorporated into these teachings to produce embodiments that have gain greater than unity, while preserving the improvement to linearity. They operate in much the same way, and are seen as a more general case where the tracking power supplies dynamically track the input voltage, or a replica thereof. The particular case of unity gain is somewhat simpler in that since in that case the output equals the input, the output is a handy replica of the input that is readily applied to the tracking power supplies.

DESCRIPTION OF A PREFERRED EMBODIMENT

Figure 1:
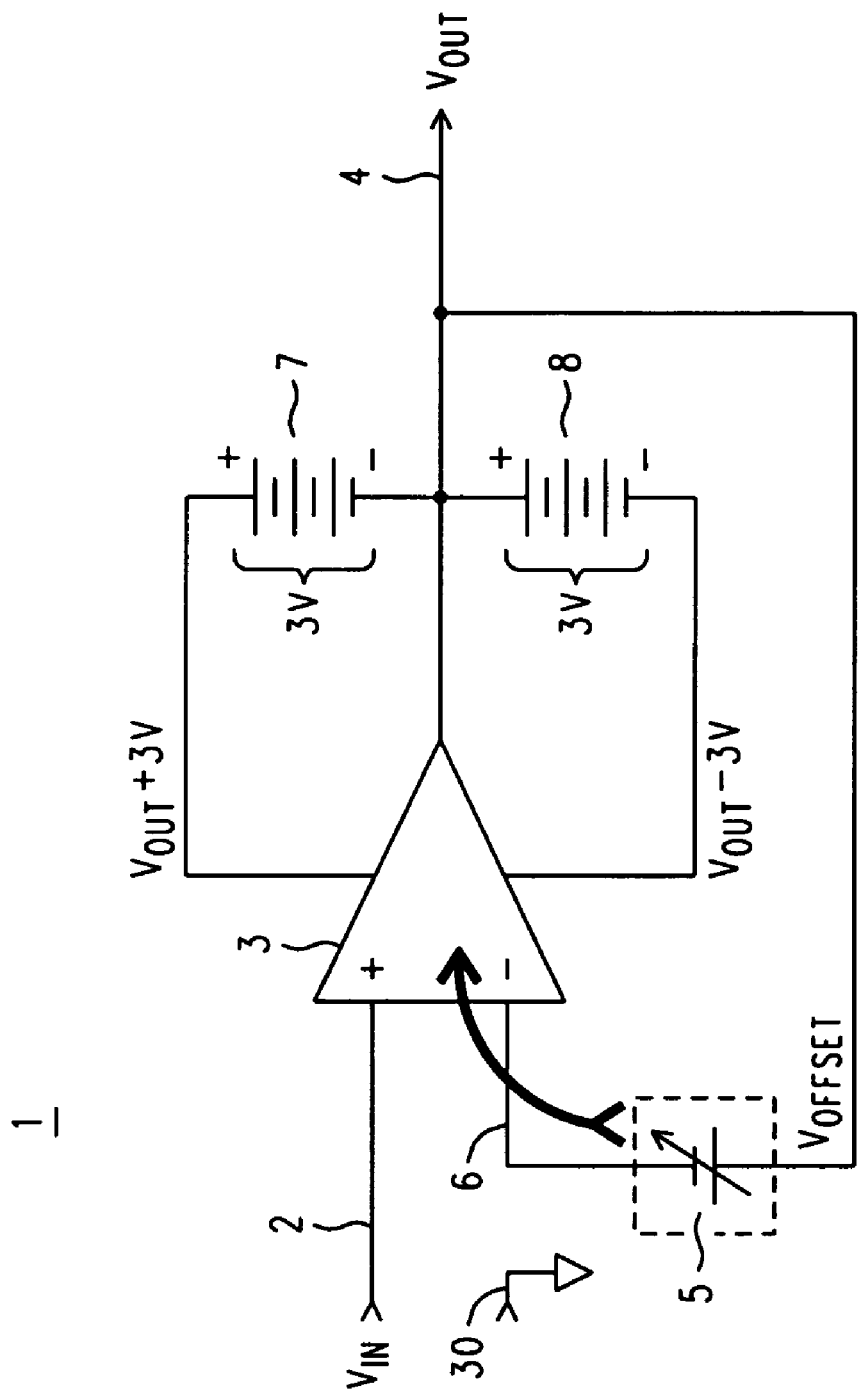
FIG. 1 is a simplified equivalent circuit diagram useful in appreciating a basic principle of operation in a unity gain amplifier constructed in accordance with the invention.

Refer now to FIG. 1, wherein is shown a simplified equivalent circuit diagram 1 useful in appreciating how a large swing unity gain amplifier with extremely high linearity can be realized using a low voltage differential amplifier. A conventional low voltage swing differential amplifier 3 has the usual plus (+) and minus (−) inputs, to which an input voltage $V_{IN}$ 2 (which is with respect to a ground 30) is applied at the plus input. The minus input is connected to the output $V_{OUT}$ (which is to be used elsewhere for whatever reason the unity gain amplifier is there in the first place . . . ). The variable $V_{OFFSET}$ supply 5 represents the equivalent source associated with the CMR mechanism within the amplifier 3. Were it not for the non-linearity associated with CMR, changes in the DC output would be expected to exactly track changes in the DC input, micro volt for micro volt, as it were. AC operation follows naturally, up to the point where the amplifier's frequency response begins to fade.

The configuration of feedback shown in FIG. 1 is readily appreciated and understood as being a unity gain non-inverting amplifier. In due course we shall lift the restriction that gain be unity.

We show the amplifier 3 as having two power supplies, which in this case are two three volt batteries 7 and 8. Battery 7 is connected to provide $V_{OUT}+3V$ as a positive power supply, while battery 8 is connected to provide $V_{OUT}-3V$ as a negative power supply. Circuit 1 is also merely exemplary, and other voltage values might be used. Part of what is to be taken from this figure is that a relatively low voltage swing amplifier can be used (say, ±5V with a combined six volt supply), even though we will obtain an output signal swing that may be several times the combination of the two batteries.

Now we get to the good part. It should be understood that we expect any differential amplifier that is operated in the general manner shown in the figure to exhibit vastly improved linearity (unless, of course, it already has no discernable non-linearity—which is pretty unlikely). That general manner is to operate the amplifier with tracking power supplies that are dynamically varied to always be the actual output plus the 'battery' (7) and the actual output minus the 'battery' (8). This allows the part to remain a low voltage part, since the effective supply voltage is just the sum of the two battery voltages. It also improves linearity because the part is almost always operating under the same conditions relative to the perceived power supplies. This minimizes the opportunity for any inherent non-linearity to manifest itself. A further improvement in linearity results because now the feedback loop is free to devote the entire gain resource of the amplifier to null out any detected difference between the applied input and the already fairly linear output. The feedback is more than sufficient to null out any slight errors in the tracking power supplies.

Upon some reflection, however, the following defect in the circuit of FIG. 1 will be noticed. Although it has 'bootstrap' properties for its power supplies, it apparently has no mechanism to actually produce an output voltage $V_{OUT}$ referenced to ground that the batteries can bootstrap from. For example, just how is this arrangement supposed to produce a +10V output referenced to ground 30? (Well, we DID say that it was an equivalent circuit, and if it helped in the appreciation of the reasons why linearity is improved, then our deception was worth it, and will be forgiven.)

We might salvage circuit 1 by supposing that external to the amplifier 3 there was a suitable pull-up resistor from $V_{OUT}$ to a large B+ supply, and a corresponding pull-down resistor from $V_{OUT}$ to a corresponding B− supply. This might make circuit 1 work while using actual batteries (and supposing the amplifier had an output stage that could source and sink current for the respective external loads and their supplies), but overall that idea is pretty ugly. For one thing, it is very wasteful of power, both in the amplifier and in the resistors, and certainly would not comport with our desire to minimize cost.

On the other hand, FIG. 1 does plant the seed of a general principle for improving the linearity of an amplifier. What we need to actually realize the potential of circuit 1 of FIG. 1 is a suitable set of Tracking Power Supplies that are responsive to $V_{OUT}$ and that produce $V_{OUT}+V$ and $V_{OUT}-V$, where V is some suitable value, e.g., 3V for a part rated at a 5 VP-P output swing. If we do that, then the plus and minus supplies applied to the amplifier will indeed be referenced to ground and balanced about $V_{OUT}$, and the promise of FIG. 1 will be realized.

Figure 2:
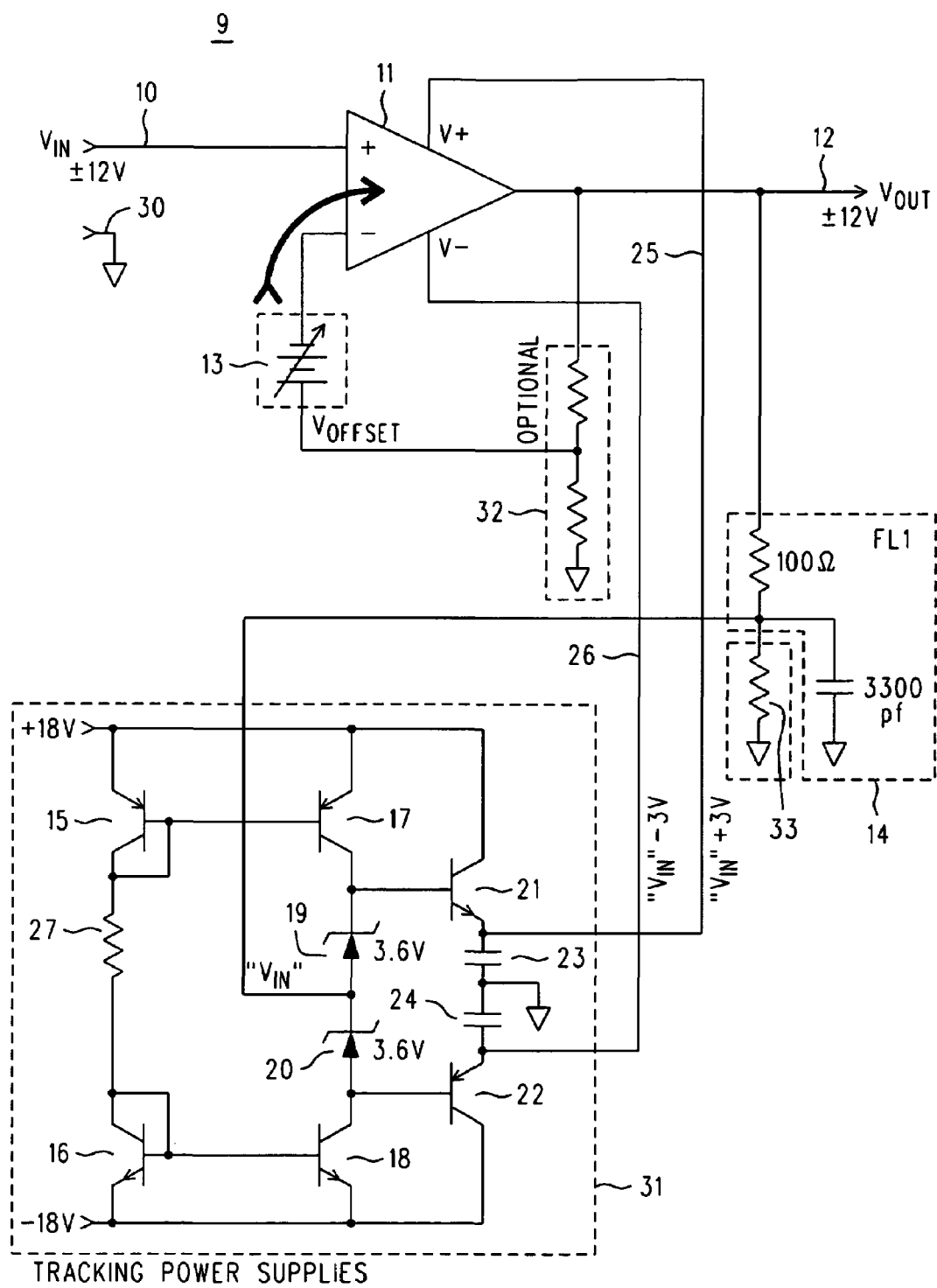
FIG. 2 is a slightly simplified schematic for a circuit that is a first embodiment of an amplifier of unity (or greater) gain having dynamically tracking power supplies and constructed in accordance with the principles of operation shown in FIG. 1.

Now refer to FIG. 2, wherein is depicted a simplified schematic for a first preferred embodiment 9 that practices the principles of the invention. As before, an input voltage $V_{IN}$ 10 is coupled to the plus (+) input of a suitable conventional high gain low voltage differential amplifier 11, which might be an AD 8605 from Analog Devices Corp. The amplifier produces an output $V_{OUT}$ 12 that is utilized elsewhere, and that is applied though the (equivalent CMR) variable $V_{OFFSET}$ Supply 13 to the minus (−) input terminal of the amplifier 11. Neglecting the optional components 32 and 33, this feedback configuration produces, of course, the classic unity gain non-inverting amplifier.

Because the amplifier 11 will be operated with Tracking Power Supplies that provide $V_{IN}$+3V (25) and $V_{IN}$−3V (26), and since those Tracking Power Supplies originate with a healthy ±18V, it will be appreciated that we shall have no trouble allowing the input $V_{IN}$ to range over ±12V while also expecting the output $V_{OUT}$ to likewise vary as ±12V.

With that, we direct the reader's attention to the bottom third of the figure for an explanation of Tracking Power Supplies 31. Ignoring for now the filter FL1 (14), note that the (filtered) $V_{OUT}$(=$V_{IN}$!) is applied to the junction of two 3.6V zener diodes (19,20). The series transistors 17 and 18 on each side of the zeners are a constant current source (I=$I_C$), and as such the voltage drops across each will comply to maintain the current at a steady amount. Note that it is fair to characterize the output $V_{OUT}$(=$V_{IN}$!) of the amplifier 11 as a (albeit adjustable) constant voltage source whose level is set by $V_{IN}$. The amount of current $I_C$ is small compared to the ability of the amplifier 11 to source and sink current to achieve its constant voltage output: as for the voltage at the junction of the two zeners 19 and 20, it is equal to $V_{IN}$, and the amplifier maintains that voltage without difficulty. Also, the voltage drop across the filter 14 needed to pull the zeners is not enough to upset things. In any event, a small voltage drop there (across the 100 Ω resistor) would just cause a minor offset in the two supplies away from $V_{IN}$. Any resulting small decrease in the amount of linearity improvement is strongly mitigated by the feedback of the amplifier 11, and is insignificant.

To continue, we now have at the junction of the two zeners a replica of $V_{IN}$, or very close to it. The positive end of zener 19 will be at $V_{IN}$+3.6V, while the negative end of zener 20 will be a $V_{IN}$−3.6V. Starting with the base of transistor 21 (zener 19) at $V_{IN}$+3.6V, transistor 21 is essentially an emitter follower from the +18V supply, and assuming a 0.6V base-emitter drop, its emitter will be shifted to $V_{IN}$+3V (25). Likewise, starting with the base of transistor 22 (zener 20) at $V_{IN}$−3.6V, transistor 22 is also essentially an emitter follower from the −18V supply, and assuming a 0.6V base-emitter drop, its emitter will be shifted to $V_{IN}$−3V (26).

The two capacitors 23 and 24 may be in the range of 0.5 uf to 0.01 uf or so, and serve to provide the amplifier 11 with genuine AC grounds for its power supply voltages 25 and 26. They also assist in oscillation prevention, as discussed in connection with the filter FL1 (14).

Transistors 15 and 16, and their intervening series resistor 27 (which might, for example, be in the range of 75 KΩ) cooperate with transistors 17 and 18 to form a complementary symmetry current mirror. The current through resistor 27 will determine the constant current ($I_C$) maintained through transistors 17 and 18.

Filter FL1 (14) is an RC filter applied to $V_{OUT}$ from the amplifier 11 before it is used to drag the voltage at the junction of the zener diodes 19 and 20. Its function is to help quash any oscillations in the amplifier output that would be sustained by a positive feedback path that involved coupling through the Tracking Power Supply outputs 25 and 26 and back into the amplifier 11 through its power supply inputs. We show a 100 Ω resistor and a capacitor of 3300 pf as FL1. It will be appreciated that these values are merely exemplary. The series drop across the resistor is not too big of an issue, so long as it remains relatively small. To that end we don't want the resistor to be too large. To assist the filter 14 in the prevention of oscillations coupled through the Tracking Power Supply is another reason why capacitors 22 and 23 are present, and are relatively big.

There no particular special requirements (high precision, etc.) that the components of the Tracking Power Supplies need to posses. There, however, are some common sense practices that are appropriate if the best performance is desired over a wide range of operating conditions. These practices will be well known to the skilled designer, and include possibly using a dual transistor (two devices thermally coupled together in one package) for transistors 15/17 (e.g., an MUN 5116 DW1T1 from ON Semiconductor of Phoenix, Ariz.) and also for transistors 16/18 (e.g., an MUN 5216 DW1T1 from ON). It may also be advantageous to have transistors 21 and 22 be a set of factory matched complementary devices supplied in one package, such as the ON MUN 5116 DW1T1.

The non-unity gain case is readily appreciated at this point. To obtain other than unity gain we add the voltage divider 32 from the amplifier output 12 to ground. The point of division is connected to the minus (−) input of the amplifier, as opposed to the unity gain case where the output was directly connected to the (−) input. As in well known, this will provide some gain G greater than one, depending upon the ratio of the resistors in the divider 32. One additional thing is left to do however, as what the Tracking Power Supplies 31 must do is track the applied input $V_{IN}$, and not the amplified output $GV_{IN}$. This is easily arranged, however by including resistor 33, which forms with the 100 Ω resistor in FL1 a voltage divider of the same ratio as the divider 32, reducing $V_{OUT}$ back down to provide a 'copy' of $V_{IN}$ that is sent to the Tracking Power Supplies 31. (This little gimmick is not needed when there is unity gain, as $V_{OUT}$ equals $V_{IN}$ already . . . .)

Figure 3:
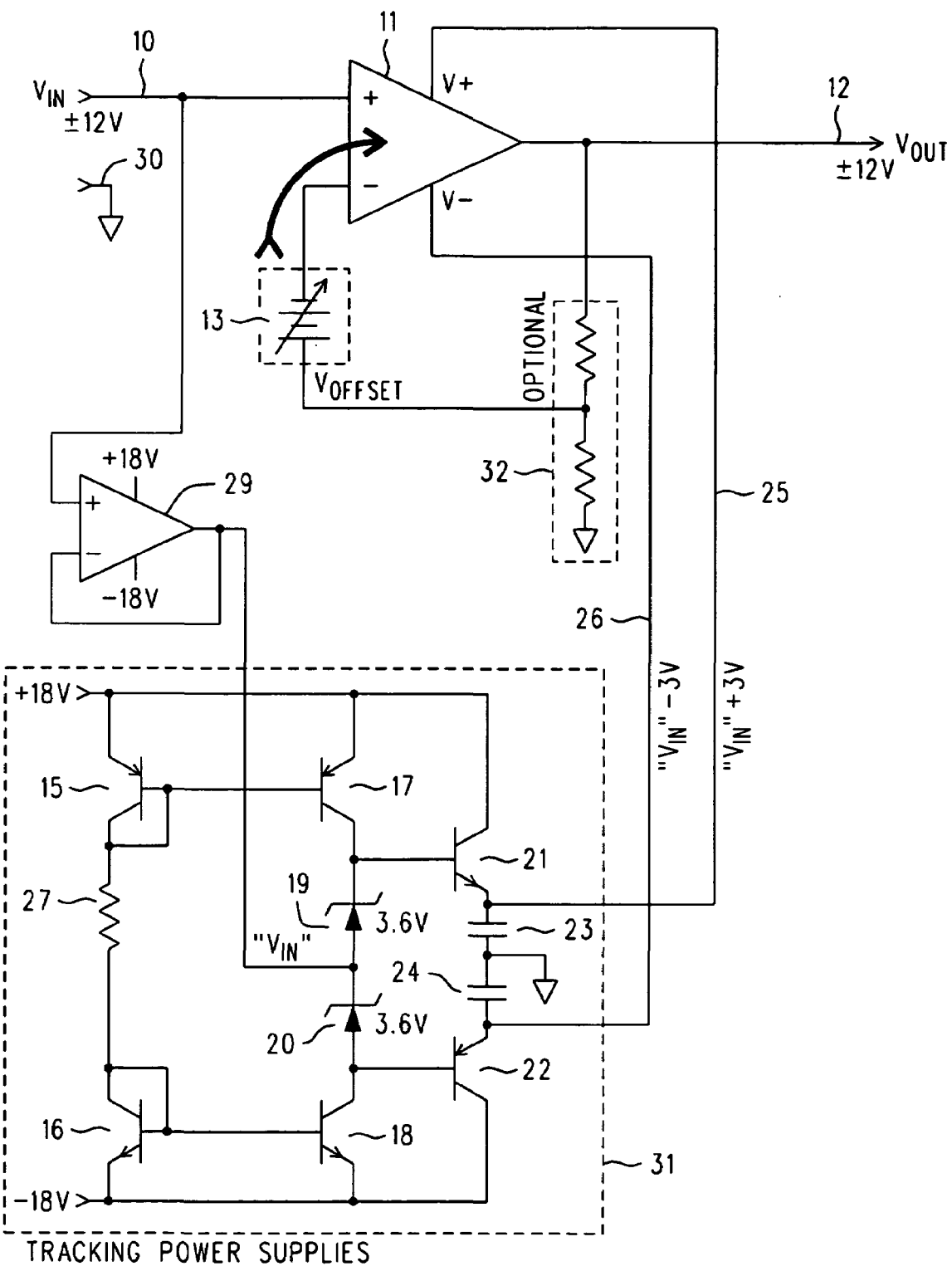
FIG. 3 is a slightly simplified schematic for a circuit that is a second embodiment of an amplifier of unity (or greater) gain having dynamically tracking power supplies and constructed in accordance with the principles of operation shown in FIG. 1.

FIG. 3 depicts a simplified schematic for an alternate embodiment 28 that is similar in its major aspects to the embodiment 9 of FIG. 2. In that connection, the corresponding elements have the same reference numerals and other legends in both figures, and thus an explanation of the basic operation of FIG. 3 need not be repeated. The main difference is that FL1 (14) is absent from FIG. 3, and is replaced by a conventional unity gain amplifier 29. Its purpose is to directly buffer $V_{IN}$ to the amplifier 11 before it is used to drag the voltage at the junction of the zener diodes 19 and 20. Any gain error or non-linearity displayed by amplifier 29 will be small, and its effects on the benefits provided by tracking power supplies 25 and 26 will be negligible. (Recall what was said about any drop across the series resistor in FL1 of FIG. 2; the same reasoning applies here, too.)

We show a unity gain buffer 29 in FIG. 3, as in many applications it would be considered unwise to directly couple the input $V_{IN}$ to the indicated "$V_{IN}$" as the input to the Tracking Power Supplies 31. In the case of a high accuracy voltmeter, for example, the loading on that input is kept to an absolute minimum. Hence our buffer 29. In other applications this might not be a concern, and buffer 29 could be omitted.

We claim:

1. A method of operating a differential amplifier having (+) and (−) inputs for receiving an input signal $V_{IN}$, positive and negative power supply inputs, and an output for producing an output signal $V_{OUT}$, the method comprising the steps of:
   (a) coupling the input signal $V_{IN}$ to the (+) input of the amplifier;

(b) coupling a version of the output signal $V_{OUT}$ to the (−) input of the amplifier;

(c) creating a replica of the input signal $V_{IN}$;

(d) coupling the replica to a circuit that generates the voltages $V_{IN}+N$ and $V_{IN}-N$, where N is a voltage satisfying the relation $0<N\leq|V_{IN}|$;

(e) coupling $V_{IN}+N$ to the positive power supply input of the amplifier; and (f) coupling $V_{IN}-N$ to the negative power supply input of the amplifier.

2. A method as in claim 1 wherein step (b) comprises directly coupling $V_{OUT}$ to the (−) input and $V_{OUT}=V_{IN}$.

3. A method as in claim 1 wherein step (b) comprises coupling a fraction of $V_{OUT}$ to the (−) input and the replica of $V_{IN}$ created by step (c) is a duplicate portion of the fraction of $V_{OUT}$.

4. A method as in claim 1 wherein the replica created in step (c) is created by unity gain buffering of $V_{IN}$.

5. A method as in claim 1 wherein the replica created in step (c) is created by directly connecting to $V_{IN}$.

6. A method as in claim 1 further comprises the step (f) of filtering the replica before it is used in steps (e) and (f).

7. A unity gain amplifier circuit comprising:

a differential amplifier having (+) and (−) inputs for receiving an input signal $V_{IN}$, positive and negative power supply inputs, and an amplifier output which produces a signal $V_{OUT}=V_{IN}$;

the (−) input being directly coupled to the amplifier output;

a tracking power supply having an input coupled to the amplifier output and having first and second power supply outputs respectively producing thereat the voltages $V_{OUT}+N$ and $V_{OUT}-N$, where N is a voltage satisfying the relation $0<N\leq|V_{IN}|$; and the first power supply output being connected to the positive power supply input of the amplifier, and the second power supply output being connected to the negative power supply input of the amplifier.

8. An amplifier as in claim 7 further comprising a filter coupled between the amplifier output and the input of the tracking power supply.

9. An amplifier as in claim 7 further comprising a unity gain buffer coupled between the (+) amplifier input and the input of the tracking power supply.

10. An amplifier as in claim 7 further comprising a direct connection between the (+) amplifier input and the input of the tracking power supply.

11. An amplifier circuit of gain G>1 comprising:

a differential amplifier having (+) and (−) inputs for receiving an input signal $V_{IN}$, positive and negative power supply inputs, and an amplifier output which produces a signal $V_{OUT}=GV_{IN}$;

a first voltage divider having an input coupled to the amplifier output and an output coupled to the (−) input of the amplifier and that couples a fraction $1/G$ of $V_{OUT}$ to the (−) input of the amplifier;

a second voltage divider having an input coupled to the amplifier output and an output that produces the fraction $1/G$ of $V_{OUT}$;

a tracking power supply having an input coupled to the output of the second voltage divider and having first and second power supply outputs respectively producing thereat the voltages $V_{IN}+N$ and $V_{IN}-N$, where N is a voltage satisfying the relation $0<N\leq|V_{IN}|$; and the first power supply output being connected to the positive power supply input of the amplifier, and the second power supply output being connected to the negative power supply input of the amplifier.

12. An amplifier as in claim 11 wherein the second voltage divider further comprising a filter.

13. An amplifier as in claim 11 further comprising a unity gain buffer coupled between the (+) amplifier input and the input of the tracking power supply.

14. An amplifier as in claim 11 further comprising a direct connection between the (+) amplifier input and the input of the tracking power supply.

* * * * *

UNITED STATES PATENT AND TRADEMARK OFFICE
CERTIFICATE OF CORRECTION

PATENT NO. : 7,262,663 B2 Page 1 of 1
APPLICATION NO. : 11/259507
DATED : August 28, 2007
INVENTOR(S) : Coley et al.

It is certified that error appears in the above-identified patent and that said Letters Patent is hereby corrected as shown below:

TITLE page, ITEM (57), under "Abstract", in column 2, line 14, delete "maybe" and insert -- may be --, therefor.

Signed and Sealed this

Twenty-fifth Day of December, 2007

JON W. DUDAS
*Director of the United States Patent and Trademark Office*